(12) United States Patent
Correia et al.

(10) Patent No.: US 6,213,376 B1
(45) Date of Patent: *Apr. 10, 2001

(54) STACKED CHIP PROCESS CARRIER

(75) Inventors: George C. Correia, Warrenton, VA (US); John E. Cronin, Milton; Edmund J. Sprogis, Underhill, both of VT (US)

(73) Assignee: International Business Machines Corp., Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/098,828

(22) Filed: Jun. 17, 1998

(51) Int. Cl.$^7$ .......................... B23K 37/04; B23K 31/02; B25B 27/14; B23Q 3/00
(52) U.S. Cl. .................. 228/44.7; 228/49.1; 228/212; 29/281.5; 269/270
(58) Field of Search .................. 228/44.3, 44.7, 228/212, 49.1, 49.5; 269/287, 269, 270, 903; 29/281.5, 228, 269

(56) References Cited

U.S. PATENT DOCUMENTS

| | | | |
|---|---|---|---|
| 3,610,612 | * 10/1971 | Day | 269/69 |
| 3,849,857 | * 11/1974 | Murray, Jr. | 269/60 |
| 3,920,295 | * 11/1975 | Speckin | 312/108 |
| 4,473,455 | * 9/1984 | Dean et al. | 204/298 |
| 4,703,920 | 11/1987 | Grabbe et al. . | |
| 4,804,130 | * 2/1989 | Kwan et al. | 228/6.2 |
| 4,993,895 | * 2/1991 | Nordstrom | 408/103 |
| 5,034,802 | * 7/1991 | Liebes, Jr. et al. | 357/74 |
| 5,060,846 | 10/1991 | Schaeffer et al. . | |
| 5,332,463 | * 7/1994 | Eberlein et al. | 156/556 |
| 5,431,331 | * 7/1995 | Ney et al. | 228/212 |
| 5,460,320 | 10/1995 | Belcher et al. . | |
| 5,563,444 | 10/1996 | Leroux et al. . | |
| 5,578,527 | 11/1996 | Chang et al. . | |
| 5,766,972 | * 6/1998 | Takahashi et al. | 438/127 |
| 5,766,975 | * 6/1998 | Templeton, Jr. et al. | 437/209 |
| 5,907,474 | * 5/1999 | Dolbear | 361/705 |

* cited by examiner

*Primary Examiner*—Geoffrey S. Evans
*Assistant Examiner*—Keley Stoner
(74) *Attorney, Agent, or Firm*—Scully, Scott Murphy & Presser; James M. Leas, Esq.

(57) ABSTRACT

An apparatus used for holding a first semiconductor device in proper alignment to a second semiconductor device, whose size is different from the first device, while performing a C4 bond between the two devices. The apparatus for holding the two devices in proper alignment consists of a holding fixture, which includes upper and lower pocket receptacles for receiving the semiconductor devices. The semiconductor devices are placed into the respective upper and lower slots aligned to two or more edges of the holding fixture.

7 Claims, 7 Drawing Sheets

STACKED CHIP PROCESS CARRIER

BACKGROUND OF THE INVENTION

1. Field of the Invention

This invention relates generally to workpieces and manufacturing methods used during soldering procedures. More particularly the invention addresses a method and apparatus to hold in proper alignment two or more semiconductor devices insuring the bonding operation.

2. Discussion of the Prior Art

Processes for direct chip attachment (DCA) of semiconductor IC's to substrates are known, and are being used extensively in the industry. A key feature of the technique is the fabrication of minute solder balls or "Bumps" on the semiconductor die with a process similar to that described in U.S. Pat. Nos. 3,401,126 and 3,429,0401 known as C4 for Controlled Collapse Chip Connection. Attaching the "bumped" die to a suitable substrate is achieved by applying a flux to either the die or substrate surface, aligning the two components usually with optical image recognition systems, placement to achieve contact, and reflow, which is the joining of the interconnect is a high temperature furnace.

Currently, in the push to achieve ever-higher integration levels, there is impetus to use C4 interconnection directly between two or more semiconductor die to create a stacked component which is then mounted onto a suitable carrier such as a substrate using wirebonds. Such an assembly would fulfill a long standing need of merging many different semiconductor technologies (i.e. LOGIC, DRAM, BICMOS, SiGe, GaAs) together easily while allowing extremely high bandwidth between the individual die owing to the high density and low capacitance loading of die-to-die C4 interconnects. However, the conventional C4 joining process described above poses problems when applied to the direct joining of individual dies. In the conventional die-to-substrate attach procedure, the substrate is always larger, and typically very much larger, than the die. This size difference facilitates the application of flux since it can be easily applied only to the region where the die will attach, and does not cover other surfaces which would cause it to stick to the process fixturing. In contrast, for die-to-die attachment, both components are generally small and close to the same physical size which makes it difficult to contain the flux to only the joining surface during apply and reflow. Furthermore, if flux is used in the die-to-die attach procedure, it usually will cover the metal pads used for wirebond connections later in the assembly process. Since flux is difficult to clean without leaving some trace residuals, problems with the wirebond connection may result. Finally, stacked die configurations are envisioned where a smaller die straddles two or more larger die. The relatively loose placement tolerances of the substrate in the die-to-substrate attach procedure would preclude its successful application to die-to-die attachment. The present widely used methods for the direct chip attachment (DCA) of semiconductor IC's to substrates are inconvenient, costly and time consuming and do not not adequately address present requirements. It would therefore be extremely advantageous to provide a simple cost effective solution which achieves the aforestated objectives.

SUMMARY OF THE INVENTION

The object of the present invention is to provide an apparatus that eliminates or reduces disadvantages associated with conventional holding apparatus.

Another object of the present invention is to provide an apparatus having reasonable manufacturing costs.

Yet another object of the present invention is to provide an apparatus for aligning two or more discrete semiconductor devices without the need for fixturing tools for alignment.

A still further object of the present invention is to provide an apparatus that does not put pressure or stress on the semiconductor devices to be bonded.

Yet another object of the present invention is to provide a method that does not require flux or the complications of flux processing.

A further object of the present invention is to provide an apparatus that allows for any shape of chip (die) to be bonded without the need for a chip carrier designed for each chip set size variation.

These and other objects of the present invention are achieved by a stacked chip process and apparatus that holds in proper alignment two or more semiconductor devices of different sizes for the purpose of solder bonding. The apparatus contains two slots, a bottom slot machined to accept a wide range of smaller semiconductor devices, and a topslot machined to accept a wide range of larger semiconductor devices, where the top slot is larger than and coincident with the bottom slot. A smaller die is placed in the holder on its vertical face, aligned to at least two sides of the apparatus. A larger die is placed face down over the smaller die in the top slot. Either die may have the solder bumps predefined on it, whereas the opposite die has the metal pads and possibly even a small amount of solder. The apparatus is then place into an anneal flow cycle.

BRIEF DESCRIPTION OF THE DRAWINGS

Reference may now be had to the following detailed description of preferred embodiments of the invention, taken in conjunction with the accompanying drawings; in which.

DESCRIPTION OF THE PREFERRED EMBODIMENTS

The preferred embodiments of the present invention and its advantages are best understood by referring to FIGS. 1, 2, 3, 4 and 5 of the drawings.

FIG. 1 illustrates the semiconductor device to be bonded. FIGS. 1C and 1D illustrate that one of the two devices to be bonded will have the solder balls predefined on its vertical face, FIG. 1D, and the other die will have the metal solder bonding pads, FIG. 1C.

Figure 1A:
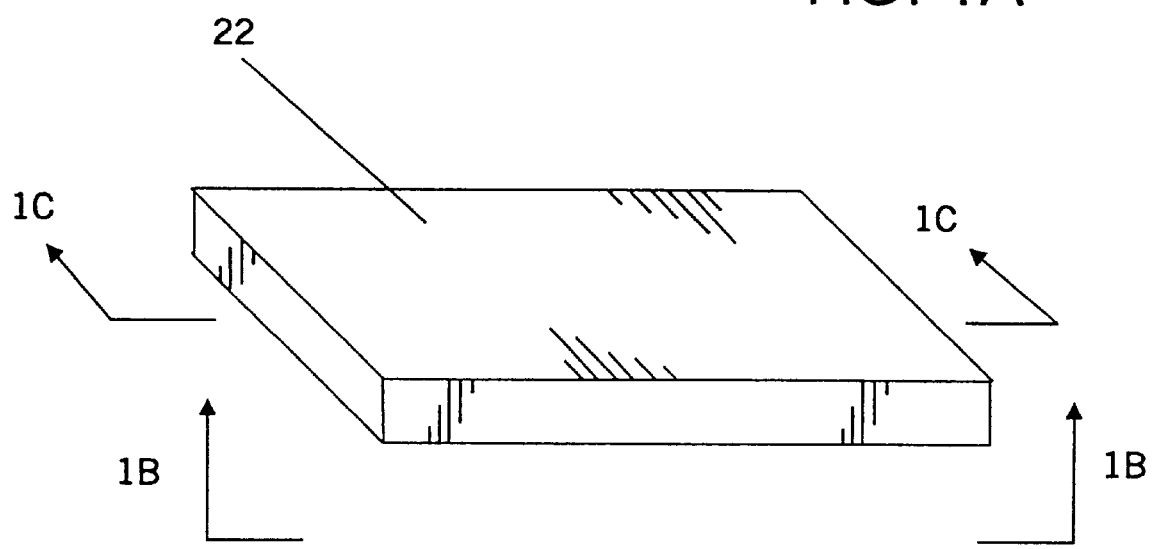
FIG. 1a–1d illustrate respective top, bottom and cross-sectional views of an IC semiconductor device shown with both attachment orientations, solder bonding pads and solder balls.
Figure 1B:
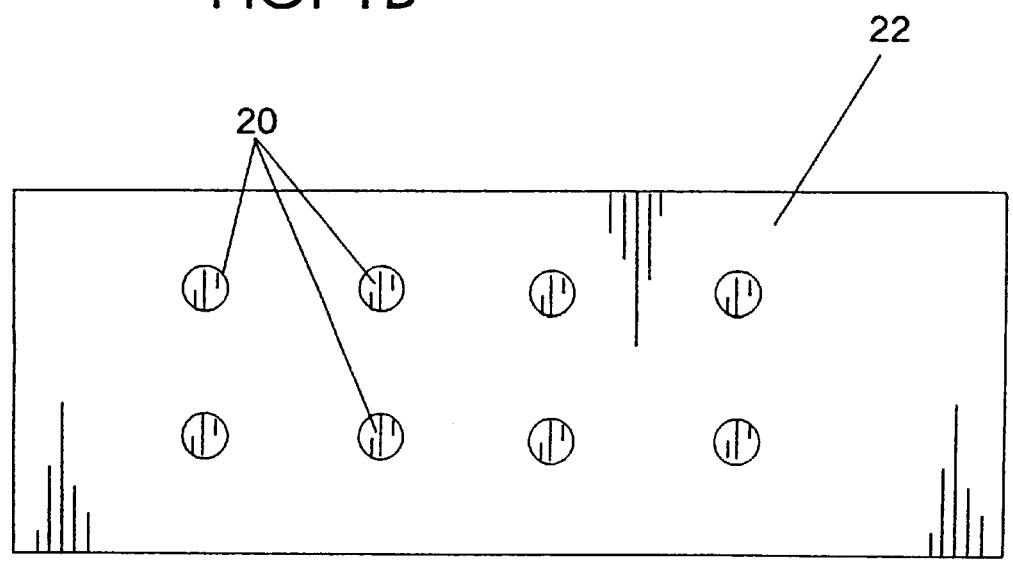
Figure 1C:
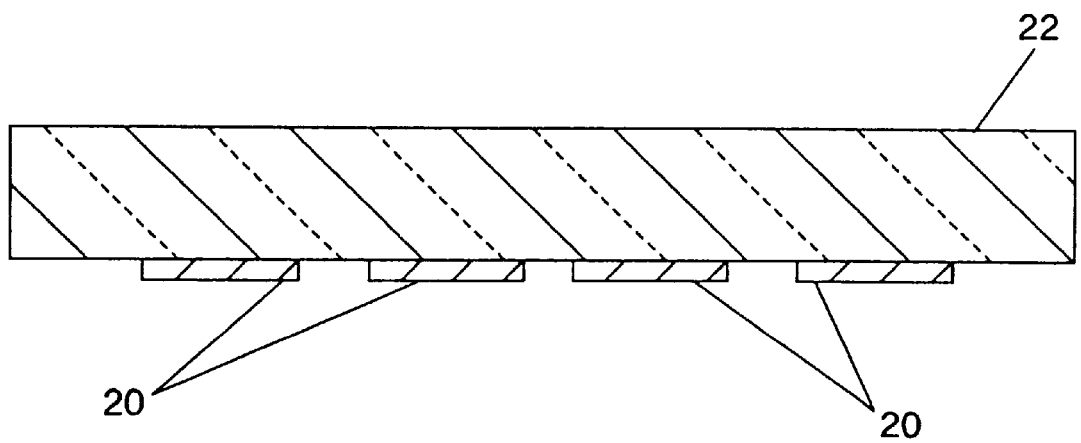
Figure 1D:
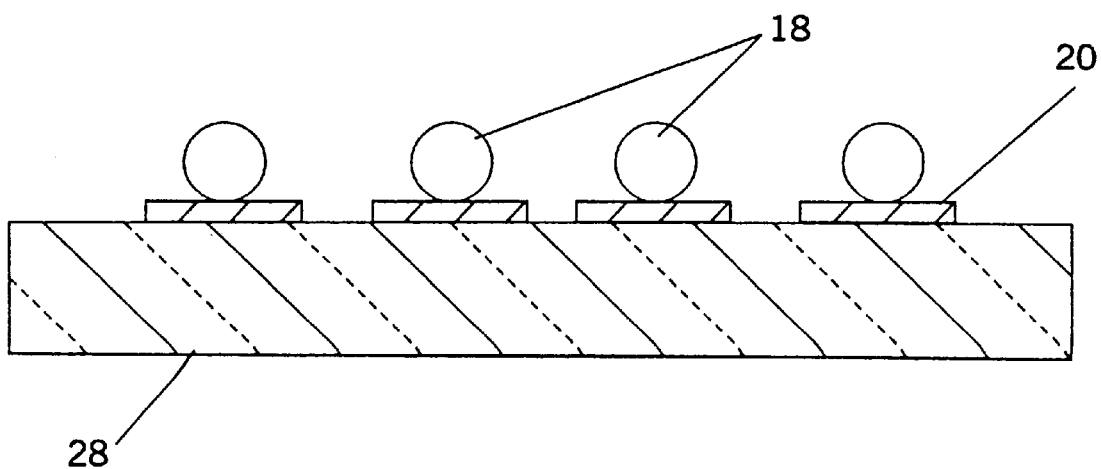
Figure 2:
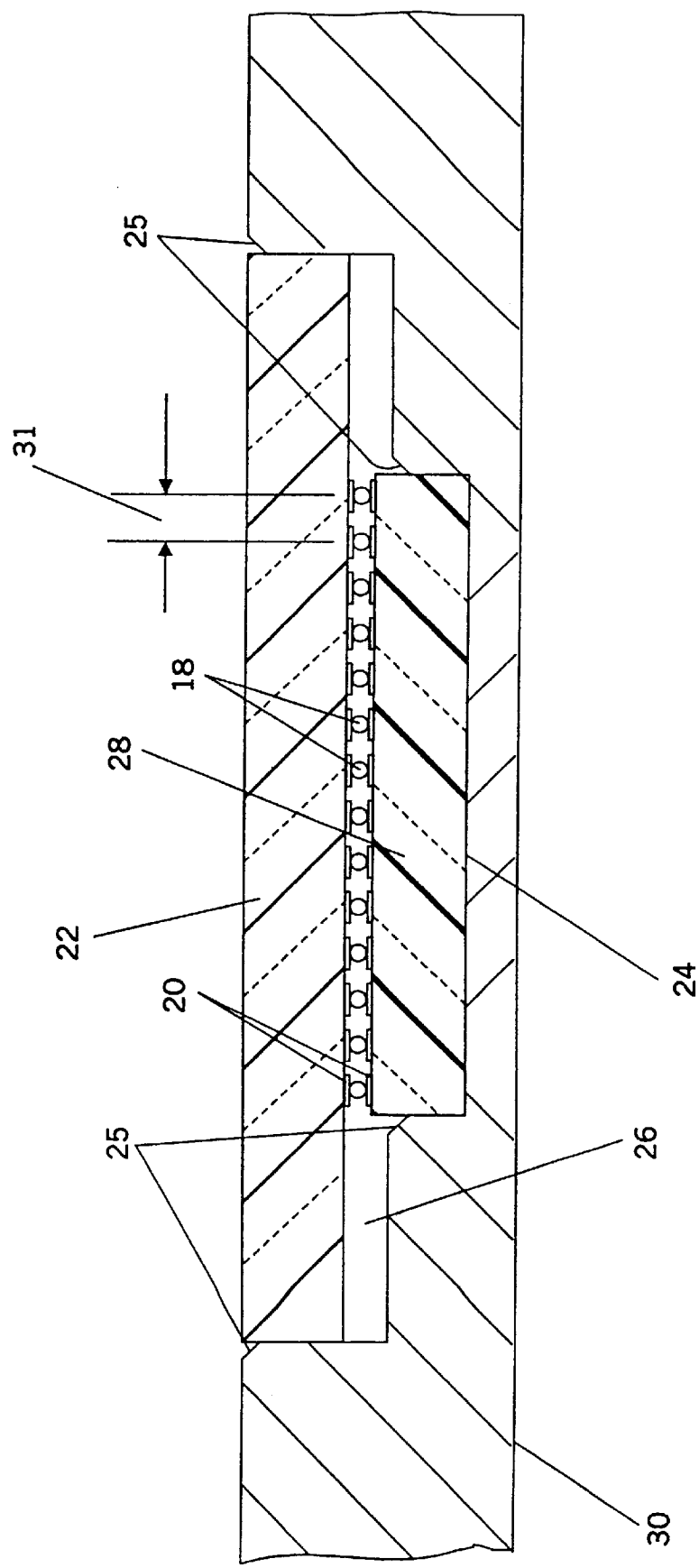
FIG. 2 illustrates a cross-sectional view of the holding apparatus.

Referring now to FIG. 2 there is illustrated a vertical cross-sectional view of the holding apparatus 30. In the preferred embodiment the fixture 30 includes a vertical surface of the apparatus having a cavity with a first stepped portion defining a bottom pocket 24 for accepting a smaller IC semiconductor device, Die 'A' 28, and a second stepped portion defining a top pocket 26 for accepting a larger IC semiconductor device, Die 'B' 22 in a manner substantially overlying the bottom pocket. The top and bottom pockets are oriented such that the dies, when deposited into the respective pocket portions, are oriented face to face with the solder balls 18 adhered to one of the dies, being aligned with the corresponding metal pads 20 of the other die. The bottom pocket 24 is machined to accept a wide range of sizes of the smaller dies, whereas the top pocket 26 is machined to accept a wide range of sizes of the larger dies. The smaller die 28 is placed in the lower pocket 26 and the larger die 22 is placed face down over the smaller die 28 in substantially overlapping relation as shown in FIG. 2 in the holder 30. Either die may have the solder balls 18 predefined on its vertical face, and the opposite die would then have the metal pads and possibly even a small amount of solder.

Figure 3A:
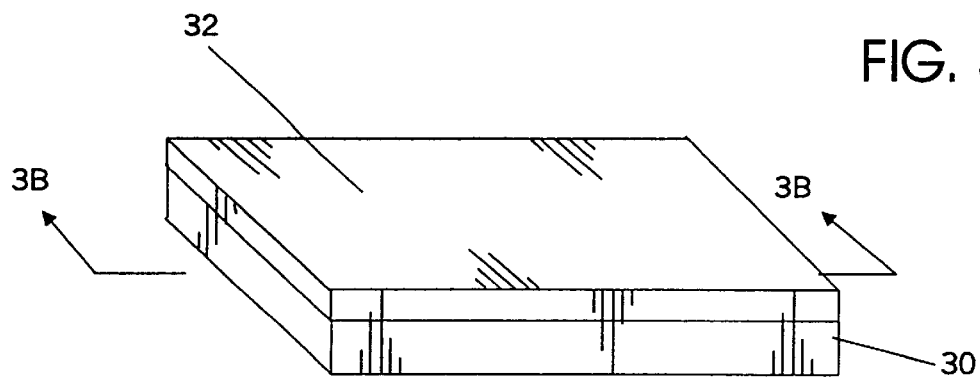
FIGS. 3a–3c illustrates the holding apparatus as shown in FIG. 2 but with spacer elements for varying die sizes.
Figure 3B:
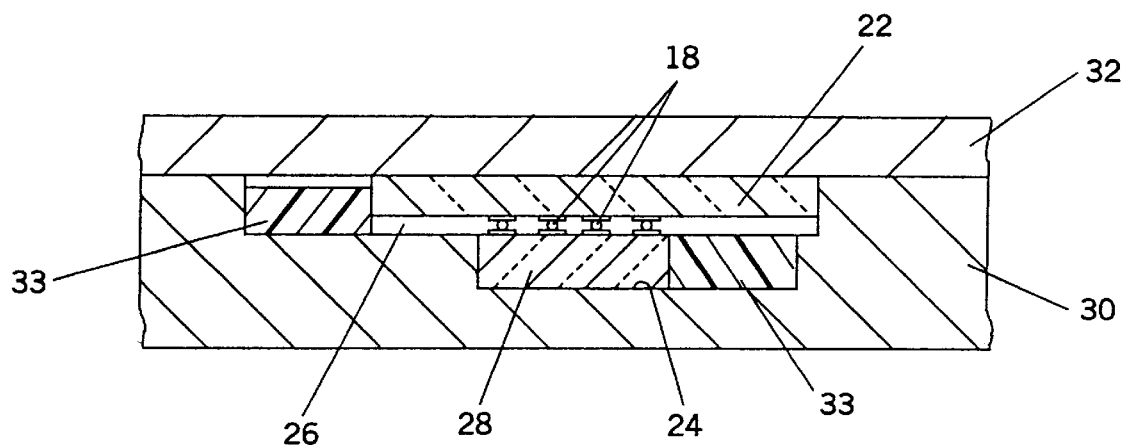
Figure 3C:
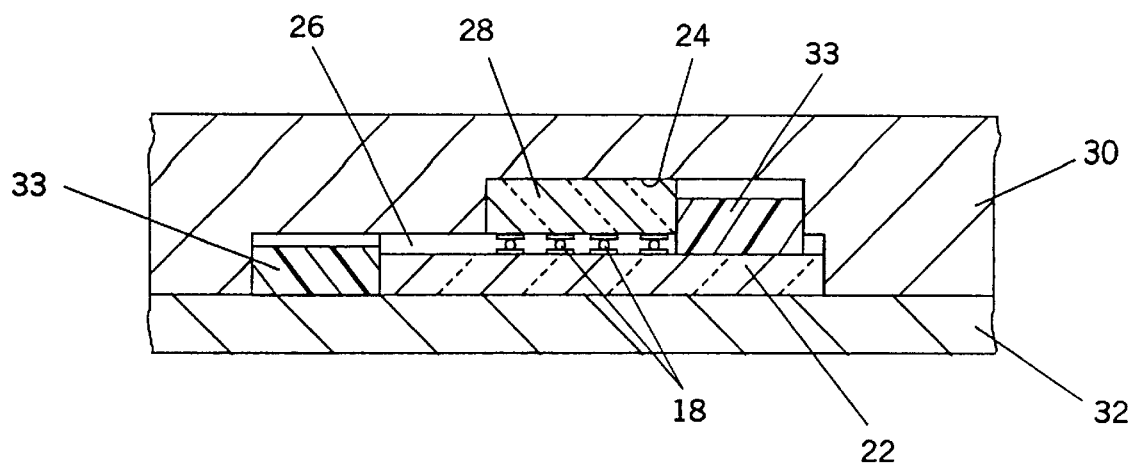

FIGS. 3a–3c illustrate the utilization of a dummy die 32 preplaced in the bottom pocket 24 and a dummy die 30 in the top pocket 26 so that both the smaller die 28 and the larger die 22 may be fixed into a predefined position.

Proper alignment of the two semiconductor devices depends upon the vertical faces in the pockets. There are two tolerances that contribute to misalignment; die dimension tolerance and pocket dimension tolerance. These combined tolerances must be less than the size of the interconnect pad.

Referring to FIG. 2, the periodicity 31 of the solder bumps 18 is on the order of 250 microns. This figure also defines the size of the associated interconnect pad. In order to achieve proper alignment the tolerance between the die pad and the bond edge must be less one half of the periodicity of the solder bumps to within an accuracy of ±5 microns. Assuming that one half the pitch of the solder balls is on the order of 125 microns, the cumulative tolerance mismatches must be less than 125 microns ±5 microns to meet the overall tolerance requirements. The tolerance mismatches sources include 1)thermal mismatches between die and apparatus, 2) die manufacturing tolerances, and 3) machining tolerances of the fixture edge. Each tolerance mismatch will be described in detail.

Thermal tolerance mismatches arise from differences in the thermal coefficient of expansion (TCE) between the fixture and the semiconductor device (die). In a preferred embodiment the fixture is fabricated of a material with a thermal coefficient of expansion (TCE) which most closely matches the (TCE) of the dies to be bonded. Materials such as Kovar, invar, and tungsten, or alloys thereof, have TCE's that are most closely matched to the TCE of the IC's. TCE mismatches for closely matched materials are of the general order of 10 microns. The second source of tolerance mismatch, die manufacturing tolerance mismatches, arise from the manufacturing tolerances associated with the production of the dies. Current manufacturing techniques provide die dicing tolerances on the order of ±5 microns. A third source of tolerance mismatch arises from the machined tolerance of the fixture edge.

Thus, the allowable tolerances in constructing pockets of the fixture edge is governed in accordance with Equation 1 which describes the overall tolerance mismatch attributable to the previously described sources. Specifically, Equation 1 states that the total allowable tolerance mismatch is defined by one half the periodicity of the solder bump spacing, 125 microns ±5 microns. The right hand side of the equation define those tolerance mismatches, which when summed must be less than or equal to the total allowance.

SUM (tolerance mismatches)<=[½solder bump spacing±5 µm Eq.1

Where the SUM (tolerance mismatches)=machined edge tolerance+die tolerance+TCE mismatch tolerance.

Given that the generally acceptable range of IC die tolerances is on the order of ±5 microns and further considering that TCE mismatch tolerances to be on the order of 10 microns leaves an allowable fixture tolerance on the order of 100 microns. Machine tolerances on the order of 100 microns represent easily buildable manufacturing tolerances. Clearly, the combined tolerances of fixture locating edge machinging, die edge machining, die edge dimensions, and die freeplay in the fixture are smaller than what is required for adequate die-to-die alignment for reflow.

Figure 4A:
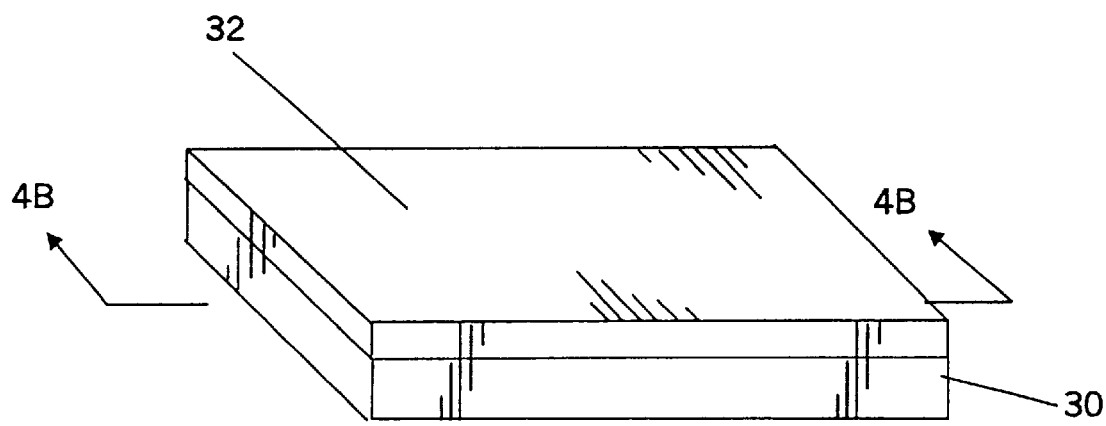
FIG. 4 illustrates an alternate embodiment of the holding apparatus as shown in FIG. 2 with a top plate to facilitate inverting the apparatus.
Figure 4B:
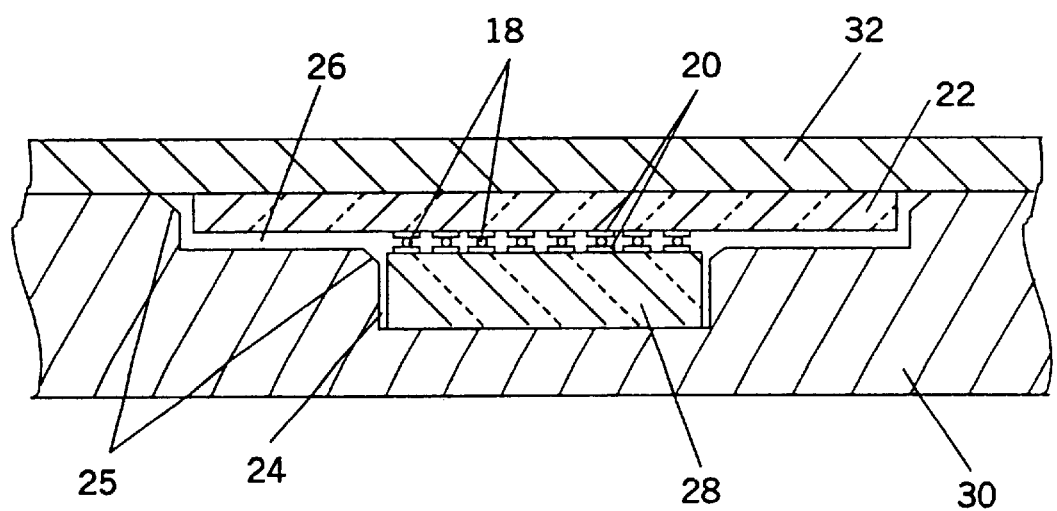
Figure 4C:
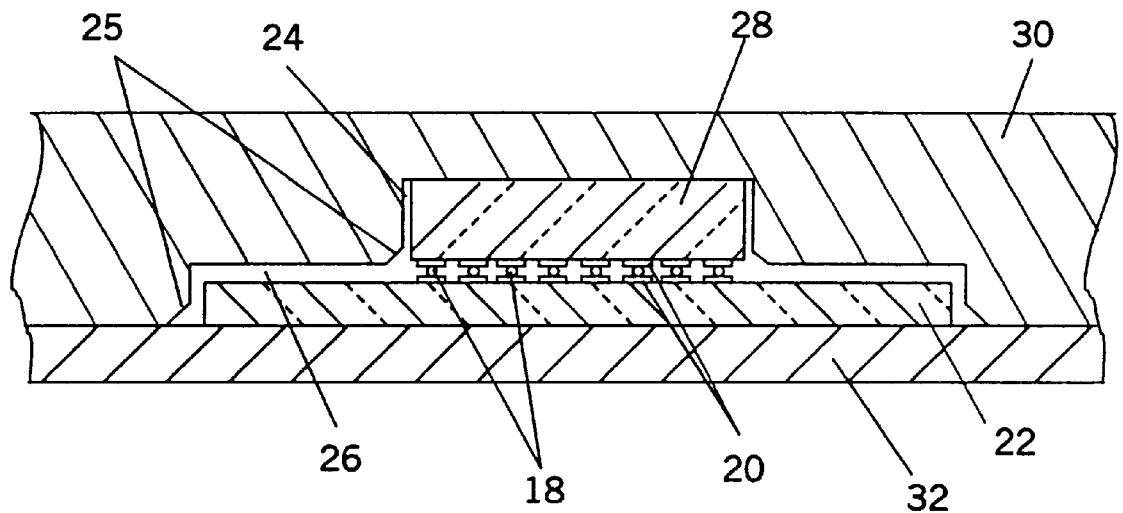

FIG. 4 illustrates a second embodiment of the holding apparatus for those situations where two dies of significantly different sizes are to be bonded. In those situations the pressure placed on the solder bonds would not be evenly distributed if inserted in the fixture of FIG. 2. A solution to this situation is described by FIG. 4 which illustrates a second plate 32 that would be placed on top of the apparatus 30 after the dies 22 and 28 have been placed inside the respective pockets 24 and 26. The entire unit would then be turned upside down as shown in FIG. 4c. Turning the apparatus has the effect of evening out the pressure on the solder balls.

Figure 5A:
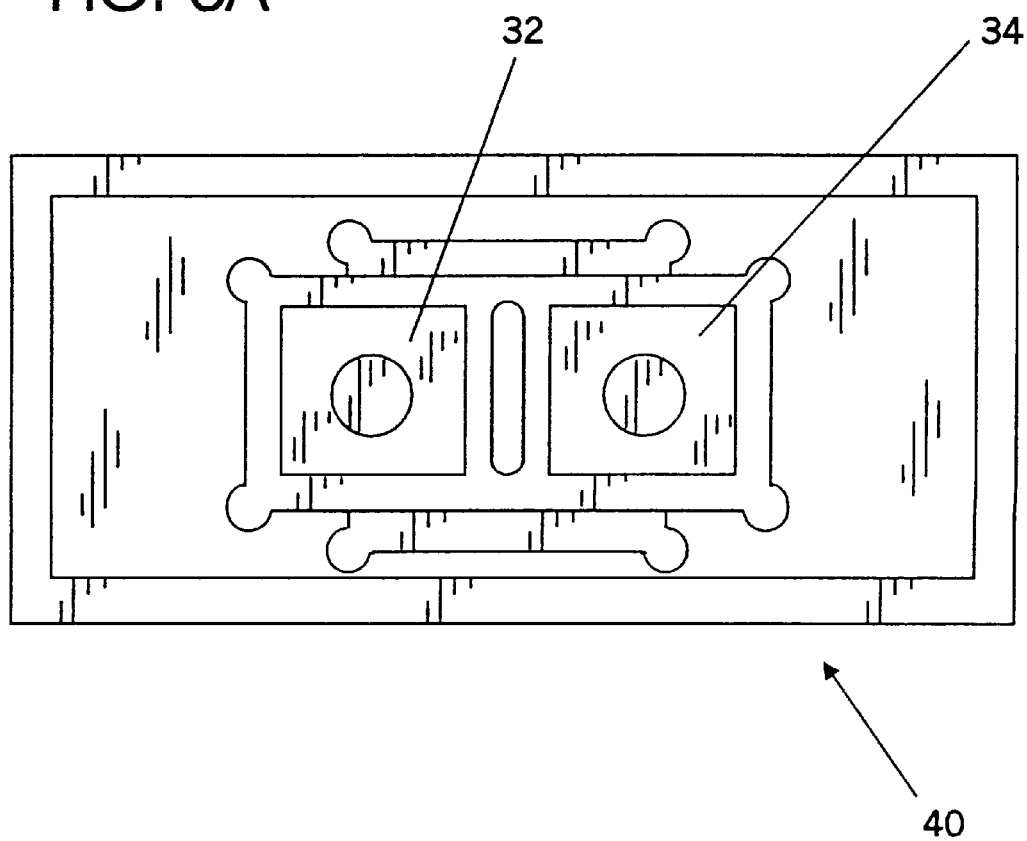
FIG. 5 illustrates an alternate embodiment of the holding apparatus for bonding a smaller die to two or more larger die.
Figure 5B:
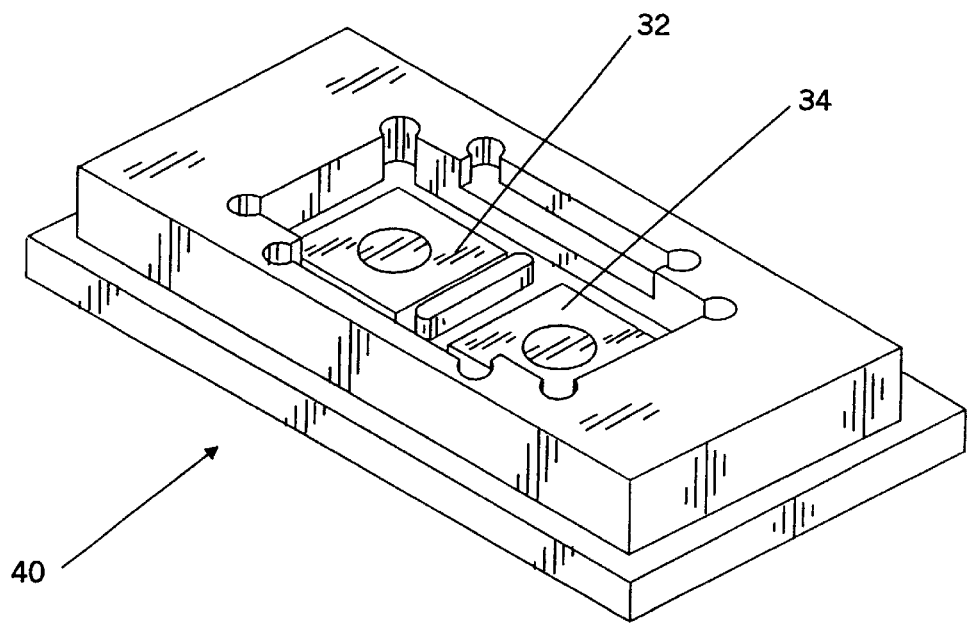
Figure 5C:
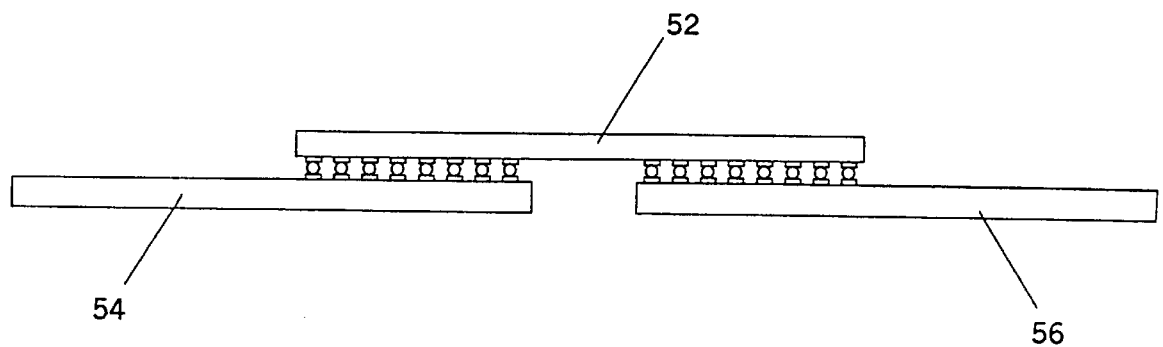

FIG. 5 depicts a third embodiment of the holding apparatus 40 for those situations where it is desired to bond a smaller die 52 to two larger dies 54 and 56. The apparatus 40 would have a cavity with a first stepped portion defining two adjacent bottom pockets 32 and 34 for accepting two smaller IC semiconductor dies 54 and 56. Placement and orientation of the respective dies would proceed in a manner similar to that described in FIG. 2.

In a preferred embodiment of the present invention, all fixture edges would be chamfered 25 to minimize potential damage to an IC. To further prevent any potential damage to an IC, the bottom inside corner of the apparatus 30 contains a groove to accommodate a pointed die edge. In a preferred embodiment the apparatus 30 would also be drilled wherever feasible to reduce the thermal mass of the fixture. Since the contact points are small relative to the apparatus, the reflow operation would be accelerated.

In a preferred embodiment the two semiconductor dies would be joined in the manner shown in FIG. 2 without the use of flux in a reducing atmosphere such as H2.

While only particular embodiments of the invention have been shown and described herein, it will be obvious that additional modifications may be made without departing from the spirit of this invention. Still, it is not intended that this invention be limited, except as indicated by the appended claims.

Having thus described our invention, what we claim as new, and desire to secure by Letters Patent is:

1. An assembly holding a plurality of semiconductor dies while the dies are bonded together, the apparatus comprising:

a plate defining i) a bottom slot for holding a range of smaller semiconductor devices, and ii) a top slot for holding a range of larger semiconductor devices; wherein the top slot is directly above the bottom slot, is larger than the bottom slot, and extends completely over and outside of the bottom slot;

a first semiconductor device disposed in the bottom slot;

a second semiconductor device disposed in the top slot;

one of the first and second semiconductor devices including a plurality of solder balls, located between the semiconductor devices, for bonding the semiconductor devices together; and wherein:

the plate includes i) first and second flat, parallel lower edge surfaces forming first and second opposite edges of the bottom slot, and ii) first and second flat, parallel upper edge surfaces forming first and second opposite edges of the top slot; and the first semiconductor device is held in a substantially fixed position in the bottom slot, by and between the first and second opposite edges of the bottom slot; and the second semiconductor device is held in a substantially fixed position in the top slot, by and between the first and second opposite edges of the top slot.

2. The assembly of claim 1 wherein said plurality of solder balls are fluxless.

3. The assembly of claim 1 further including a second plate disposed and covering the top and bottom slots.

4. The assembly of claim 1, further including a spacer located in bottom slot for filling space not occupied by the first semiconductor device.

5. The assembly of claim 1, further including a spacer located in the top slot for filling space not occupied by the second semiconductor device.

6. The assembly of claim 1, further including a spacer located in the bottom slot for filling space not occupied by the first semiconductor device and a spacer located in the top slot for filling space not occupied by the second semiconductor device.

7. The assembly of claim 1 wherein at least one of the semiconductor devices includes solder pads formed thereon.

* * * * *